United States Patent
Nakanishi et al.

[11] Patent Number: 6,096,128
[45] Date of Patent: Aug. 1, 2000

[54] SILICON CRYSTAL, AND DEVICE AND METHOD FOR MANUFACTURING SAME

[75] Inventors: Hideo Nakanishi, Tokyo; Susumu Maeda, Hiratsuka; Keisei Abe, Tokyo; Kazutaka Terashima, Ebina, all of Japan

[73] Assignees: Toshiba Ceramics Co., Ltd., Tokyo; Komatsu Electronic Metals Co., Ltd., Hiratsuka; Japan Science and Technology Corporation, Kawaguchi; Mitsubishi Materials Silicon corporation, Tokyo, all of Japan

[21] Appl. No.: 09/090,875

[22] Filed: Jun. 5, 1998

[30] Foreign Application Priority Data

Jun. 6, 1997 [JP] Japan .................................. 9-163562

[51] Int. Cl.[7] .............................. C30B 9/10; C30B 29/06
[52] U.S. Cl. ................................. 117/73; 117/78; 117/79; 117/931
[58] Field of Search .............................. 117/4, 7, 10–13, 117/17, 37, 40, 41, 43, 49, 51, 53, 73, 930–933, 78, 79

[56] References Cited

U.S. PATENT DOCUMENTS 4,357,201 11/1982 Grabmaier et al. ...................... 438/62
4,415,545 11/1983 Monkowski et al. .................... 117/78

*Primary Examiner*—Benjamin L. Utech
*Assistant Examiner*—Donald L. Champagne
*Attorney, Agent, or Firm*—Foley & Lardner

[57] ABSTRACT

A germanium layer 19 is melted on top of a starting polycrystalline silicon ingot 18, at a temperature below the melting point of pure silicon. Silicon is dissolved at the interface and floats to the top of the germanium melt to form a silicon melt layer 11, from which a crystal 20 can be drawn. The process permits the production of large diameter crystal with low oxygen content and no more than one percent germanium.

13 Claims, 4 Drawing Sheets

(A)          (B)

SILICON CRYSTAL, AND DEVICE AND METHOD FOR MANUFACTURING SAME

BACKGROUND OF THE INVENTION

1. Field of the Invention

The present invention relates to a silicon crystal, and a device and method for manufacturing the same.

2. Description of the Related Art

Silicon crystals include single crystalline silicon and polycrystalline silicon.

The single crystalline silicon is used as a starting material for manufacturing a semiconductor device such as LSI. In recent years, it has been strongly desired to manufacture a high purity single crystalline silicon with large diameter at a low cost.

The single crystalline silicon is generally manufactured by use of a CZ type crystal growing device or FZ type crystal growing device. The CZ type crystal growing device is a device most frequently used for the manufacture of single crystalline silicon. This device generally has a structure in which starting polycrystalline silicon is put into a quartz glass crucible followed by melting, and the resulting single crystalline silicon is lifted up from the melt surface. As the heating means, a carbon heating element is used, and the silicon is melted by indirect heating from the circumference of the crucible. A carbon-made holder is arranged on the outside of the quartz glass crucible in order to keep the shape.

According to this method, the quartz crucible is heated to a temperature equal to or higher than the melting point (1413° C.) of silicon. Therefore, silicon dioxide of which the quartz glass crucible is composed is eluted into the silicon melt, resulting in the incorporation of oxygen into the single crystalline silicon to be lifted up. The oxygen contained in the single crystalline silicon often effectively acts in the manufacturing process of a device to achieve intrinsic gettering function or the like, but disadvantageously increases crystal defects in a silicon wafer when a large quantity is contained.

On the other hand, the general FZ type crystal growing device adapts a method of passing a polycrystalline silicon preliminarily formed in bar into a high frequency coil having an inside diameter of several centimeters from above, and locally heating and melting it to grow the single crystalline silicon downward.

According to this method, since the melt part does not directly make contact with the quartz glass member, the oxygen incorporated into the crystal can be extremely minimized.

As described above, the oxygen concentration in the single crystalline silicon could not be sufficiently reduced in the CZ type crystal growing device. In the manufacture of a crystal with large diameter, particularly, the heating temperature had to be raised since the quartz crucible is enlarged. Therefore, the deformation of the crucible and the elution of silicon dioxide from the crucible wall were increased, and a large quantity of oxygen was incorporated into the crystal, which had a significant influence on the quality of the single crystalline silicon.

Various countermeasures have been thus made such as thickening of the quartz glass crucible to prevent the deformation of the crucible, application of a magnetic field to the silicon melt to control the melt convection, reduction of the friction between the crucible wall and the silicon melt to prevent the elution of silicon dioxide from the crucible wall, and the like. However, these leaded to a significant increase in manufacturing cost, and could not provide a sufficient effect for it.

In contrast to this, the FZ type crystal growing device can control the oxygen concentration to a low level. However, the diameter of the to be single crystalline silicon grown was limited in the FZ type crystal growing device, and a single crystalline silicon with large diameter could not be manufactured.

SUMMARY OF THE INVENTION

The present invention has an object to provide a silicon crystal in which the oxygen concentration in the crystal can be reduced, and the diameter can be also enlarged, and a device and method for manufacturing the same.

In a method for manufacturing silicon crystal of the present invention, a germanium melt layer is interposed between solid silicon raw material and silicon crystal to be grown. Further, a silicon melt layer is formed between the germanium melt layer and the silicon crystal.

According to this method of the present invention, the silicon melt can be kept in the melt state at a temperature lower than the melting point of silicon to manufacture the silicon crystal from this melt. Namely, the silicon crystal can be manufactured by melting solid silicon by heating in a temperature range of 1000–1400° C. which is lower than 1413° C. of the melting point of silicon. Therefore, the eluting quantity of a quartz member for holding the melt can be decreased to reduce the oxygen concentration incorporated into the silicon crystal. Further, the damage of a member for supporting the melt can be also reduced.

In a preferable method of the present invention, at least the germanium melt layer is heated to a temperature of 1000–1400° C.

In another preferable method of the present invention, heating is performed with a temperature gradient between the upper and lower part of the germanium melt layer.

In further another preferable method of the present invention, the thickness of the germanium melt layer is set to 5 mm–100 mm.

In further another preferable method of the present invention, the single crystalline silicon can be lifted up from the silicon melt layer by use of a seed crystal.

In a silicon crystal according to the present invention, the silicon melt is passed through the germanium melt layer to recrystallize silicon (18), whereby oxygen concentration is reduced. The oxygen concentration in the single crystalline silicon and silicon polycrystal manufactured by the present invention can be reduced to $1 \times 10^{16}$ atoms/cm$^3$ or more and less than $1 \times 10^{18}$ atoms/cm$^3$. The germanium content in the silicon crystal can be similarly reduced to 0.5–1 atoms %.

A device for manufacturing silicon crystal according to the present invention comprises a holding means for holding a germanium melt layer on the upper part of solid silicon raw material and a heater for heating it provided on the outside of the holding means, so that the silicon is recrystallized through the germanium melt layer to grow the silicon crystal.

It is convenient to make the heater movable along the outside of the holding means.

The heater can be constituted so as to heat with a temperature gradient in the axial direction of the holding means.

When the holding means is formed into tube, the solid silicon raw material can be continuously supplied from the bottom part of the holding means.

The holding means can be constituted so as to hold the recrystallized silicon polycrystal.

A lifting means can be provided above the holding means. A seed crystal formed of single crystalline silicon is provided on the end part of the lifting means, and this is brought into contact with the silicon melt layer to continuously recrystallize the silicon melt, whereby the single crystalline silicon can be manufactured.

DESCRIPTION OF THE PREFERRED EMBODIMENTS

Figure 1:
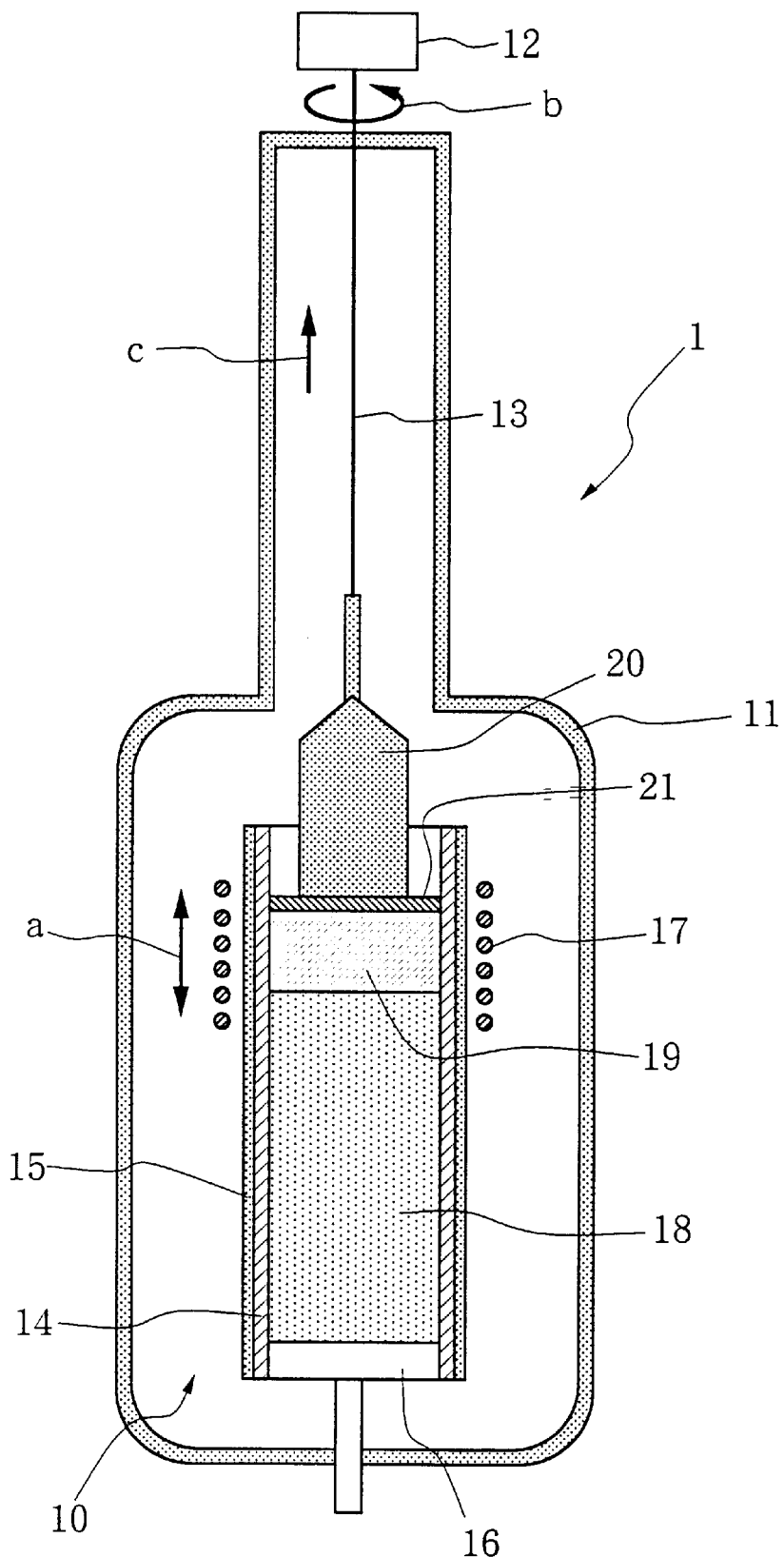
FIG. 1 is a sectional view showing a first embodiment of the present invention.

The present invention will now be described in detail with reference to the preferred embodiments thereof as shown in the accompanying drawings.

The most important technical item in the method for manufacturing silicon crystal of the present invention is to bring germanium melt into contact with a solid silicon raw material. The melting point of germanium is 936° C.

The melting point of silicon is 1413° C. as is known (it varies with literature, and is generally described as 1410–1414° C.)

However, the following fact was confirmed by the present inventors. Namely, when a solid silicon makes contact with a melt of germanium, the solid silicon is melted in the contact critical surface, and incorporated into the germanium melt even if its temperature is lower than the melting point of silicon. In such a case that the solid silicon is present under the germanium melt, for example, the melted silicon is floated on the germanium melt surface because of its density difference with the germanium melt.

The above-mentioned phenomenon occurs when the temperature of the germanium melt, more specifically, the temperature of the contact critical surface between the germanium and the solid silicon is equal to or higher than 1000° C. and lower than 1413° C.

When the temperature of the germanium melt is lower than 1000° C., the solid silicon can not be melted into germanium. Although the silicon starts to melt when the temperature exceeds 1000° C., the silicon does not come to float on the germanium melt, since it is dissolved into germanium in the initial stage of melting as described below. The practically usable temperature range is 1150° C. or higher and lower than 1350° C. In this temperature range, the solid silicon raw material melts into the germanium melt at a sufficient speed, quickly reaches the above saturated state, and then forms a silicon melt layer on the upper part of the germanium melt layer. At a temperature equal to or higher than 1350° C., which is close to the melting point of silicon, various effects of the formation of the silicon melt layer at a temperature lower than the melting point of silicon according to the present invention are reduced.

The solid silicon raw material may be in any crystalline state, or may be amorphous.

The floated silicon melt keeps the melt state in spite of the temperature lower than the melting point of silicon. Although the thickness of the silicon melt layer capable of keeping the melt state varies depending on the thermal environment around it, it is on the order of several mm when the temperature in and around the germanium melt is kept in soaking state at 1200° C. When the silicon melt is continuously floated through the germanium melt, the quantity of the silicon present on the germanium melt is increased to thicken the melt layer. At a result, recrystallization is started in the part distant from the germanium melt.

When the germanium melt of a prescribed temperature is continuously brought into contact with the solid silicon, thus, the silicon crystal recrystallized on the germanium melt layer can be continuously formed.

The cooling speed of the silicon melt is regulated at that time, whereby a polycrystalline silicon formed of dendrite type crystal grain having a grain size of 300 μm-15 mm can be manufactured.

The single crystalline silicon can be lifted up from the silicon melt layer by use of a seed crystal in the same manner as the known CZ method.

The dissolving of silicon into germanium melt is about 40 atoms % at 1200° C. Namely, the composition of the germanium melt at 1200° C. is Ge:Si=60:40 (atomic number ratio). The silicon from the solid silicon raw material is dissolved into the germanium melt until it reaches this composition, so that it does not come to float onto the upper part of the germanium melt to form the silicon melt layer. After it reaches this composition, excessive silicon is floated on the germanium melt to form the silicon melt layer.

Although the germanium is slightly contained in this silicon melt layer, the solid solubility with germanium of the silicon is extremely small, and the quantity of germanium incorporated into the recrystallized silicon crystal is about 0.5–1 atoms %.

The thickness of the germanium melt layer can be set to 5–100 mm. The more preferable thickness is 5–30 mm.

With a thickness less than 5 mm, the germanium melt might be coagulated in droplet, because of its large surface tension, so that no "layer" can be formed.

With a thickness more than 100 mm, the convention in the germanium melt might be increased to make it difficult to form a stable silicon melt layer.

Although it is difficult to actually observe the state of the germanium melt layer, according to the estimation by the present inventors, the silicon dissolved into the germanium melt is considered to be mutually collected to form an assembly while it is perfectly dissolved and floated by the density difference. The larger the thickness of the germanium melt layer to pass is, the larger the size of the assembly is. This state is considered, when compared to, similar to the state when fine oil particles are supplied from the bottom of a water tank filled with water.

This assembly is coalesced with the silicon melt layer when it reaches the surface layer of the germanium melt.

In the manufacture of silicon monocrystal, the germanium melt layer is preferably thinned so that no assembly is formed, or the assembly is not enlarged in order to minimize the influence in the coalescence of the assembly with the silicon melt layer.

In the manufacture of single crystalline silicon, the temperature gradient of germanium melt layer-silicon melt layer-recrystallized silicon polycrystal determines the size of the dendrite type silicon crystal grain in the polycrystal to be grown. When the temperature gradient is moderate, the size of the crystal grain is increased. When the temperature of the germanium melt is high, the quantity of the silicon to be floated is increased to thicken the melt layer, and the distant part is forcedly crystallized (because the temperature of the whole melt is lower than the melting point). Therefore, the crystallizing speed is raised, and the size of the crystal grain is apt to be small. Accordingly, the size of crystal grain can be controlled by controlling the germanium melt temperature and the temperature gradient.

Further, when a temperature gradient is imparted to the germanium melt layer in such a manner that the bottom part has a temperature equal to or higher than 1000° C. to be brought into contact with the solid silicon raw material, and the surface part has a temperature lower than 1000° C., the silicon dissolved in the bottom part is solidified in the course of floating in the germanium melt layer, and floated as a solid dendrite type silicon crystal grain onto the germanium melt layer surface. At this time, the thickness of the germanium melt layer and the temperature gradient are controlled, whereby a silicon crystal having a size of about 300 μm-15 mm can be provided. Since it becomes difficult to give a desired temperature gradient when a convection is generated within the germanium melt layer, a control such as addition of a magnetic field to suppress the convection is required.

In the present invention, the silicon melt can be formed at a low temperature lower than the melting point of silicon to recrystallize silicon. Thus, since the viscosity of the crucible can be kept high because of the low temperature even if a quartz glass-made material is used as the holding member of germanium and silicon melts, the silicon dioxide melted into the melt is minimized, and the oxygen concentration in the silicon crystal can be consequently reduced to about 1/100–1/1000 in the general CZ method. Namely, a silicon crystal having an oxygen concentration of $1 \times 10^{16}$ atoms/cm$^3$ or more and less than $1 \times 10^{18}$ atoms/cm$^3$ can be manufactured.

Further, a silicon crystal having a germanium content of 0.5–1 atoms % can be manufactured. When a device is constituted on the basis of such a silicon crystal containing germanium, the electron and Hall mobilities can be significantly increased, compared with a conventional one.

In the present invention, only the germanium melt layer and the upper and lower areas thereof can be heated. Namely, the solid silicon raw material can be heated only in the adjacent part with the germanium melt layer.

Embodiments Shown by the Drawings

FIG. 1 is a sectional view showing a first embodiment of a device for manufacturing silicon crystal of the present invention.

A single crystalline silicon manufacturing device 1 has a water-cooled chamber 11, and a single crystalline silicon lifting means 12 is arranged on the upper part thereon. The single crystalline silicon lifting means 12 is constituted so as to lift up a silicon crystal with rotation by a wire 13 having a seed crystal attached on the end thereof (referred to arrows (b) and (c)).

A holding means 10 for holding massy starting polycrystalline silicon 18 and germanium melt 19 is arranged within the water-cooled chamber 11. The holding means 10 is formed of a tubular high purity quartz glass member 14, a high purity carbon-made holding member 15 forming an outer tube, and a bottom member 16 forming a bottom wall. The bottom member 16 is supported by a shaft integrally fixed thereto in such a manner as to be vertically movable.

A carbon felt or the like can be interposed between the starting polycrystalline silicon 18 and the quartz glass tube 14. Since the germanium is not wetted by carbon at all, the germanium melt is never penetrated into the carbon felt. Thus, the starting silicon 18 can be pressed up by the bottom member 16. The above structure is preferred for the continuous supply of the silicon raw material.

The thicknesses of the quartz glass member 14 and the carbon member 15 supporting it can be reduced, compared with the thicknesses of a quartz glass crucible and carbon-made holding member (carbon crucible) used in the conventional CZ method. The reason for this is that the heating temperature in the execution of the present invention can be set to not a temperature equal to or higher than 1413° C. of the melting point of silicon which is adapted in the conventional CZ method, but about 1000–1400° C. close to the melting point of germanium, preferably 1150–1350° C.

A heating high frequency coil 17 is arranged on the circumference of the tubular support means 10 so as to heat a relatively narrow axial range. The high frequency coil 17 is vertically movable as shown by an arrow (a).

When the position of the germanium melt is fluctuated by the lifting of silicon crystal, the high frequency coil 17 is moved so as to heat, centered with respect to the germanium melt layer 19, the upper layer part of the starting polycrystalline silicon 18 on the lower side and a silicon melt 21 on the upper side as shown in the drawing.

When the bottom member 16 is pressed up together with the lifting of silicon crystal to constantly keep the position of the germanium melt layer, the high frequency coil 17 can not be moved.

The high frequency coil 17 can be constituted so as to heat with a temperature gradient. It may have a structure separated into several heat zones.

In the manufacture of single crystalline silicon 20, the starting polycrystalline silicon 18 is put into the cylindrical support means 10, and germanium is arranged thereon. The chamber is kept in vacuum inert gas atmosphere.

A power is applied to the high frequency coil 17 to make the carbon member 15 generate a heat, and the germanium and the periphery thereof are heated to about 1000–1350° C. to melt the germanium, whereby a germanium melt layer 19 is formed.

Then, the starting polycrystalline silicon 18 in the boundary area is melted into the germanium melt layer 19 regardless of the temperature lower than the melting point of silicon, and floated on the germanium melt layer 19 by the density difference with germanium to form a silicon layer 21.

The single crystalline silicon 20 is lifted up from the silicon layer 21 in the same manner as the general CZ method by the single crystalline silicon lifting means 12.

Since the solid solubility of silicon with germanium is extremely low, the quantity of the germanium incorporated into the grown silicon crystal is about 0.5–1 atoms %.

In the above-mentioned process, the silicon layer formed on the germanium melt layer 19 is kept at a temperature lower than the general melting point. Since only the narrow range of the germanium melt layer 19 and the periphery thereof is heated, the power consumption can be significantly reduced, compared with a conventional CZ furnace. The damage to the quartz glass member 15 contact with the melt is also minimized because of the low temperature. Further, the oxygen quantity incorporated into the single crystalline silicon can be also significantly reduced since the quantity of the silicon dioxide eluted to the melt is remarkably reduced.

EXAMPLE 1

By use of the single crystalline silicon manufacturing device described above, a single crystalline silicon lifting test was performed.

A quartz glass tube with an inside diameter of 200 mm and a length of 400 mm was used as the quartz glass-made tubular member, and a high purity carbon member was used as the outer tube. A cylindrical starting polycrystalline silicon (about 22 Kg) having a diameter of 200 mm and a height of 300 mm was put into the quartz glass tube, 1 Kg of germanium was arranged thereon, and the starting material upper part and germanium were heated. When they was successively heated to 1200° C., germanium was perfectly melted to form a layer in a thickness of about 6 mm on the upper part of the silicon starting material, and a silicon melt layer was formed on the upper part thereof. A seed crystal was brought into contact with the silicon melt layer to lift up a single crystalline silicon about 70 mm in diameter. The furnace temperature in silicon melting start, the crystal growing melt holding surface temperature, and the oxygen quantity in the resulting single crystalline silicon were measured. The results are shown in the column of Example (silicon+germanium) of Table 1.

COMPARATIVE EXAMPLE 1

For comparison, only the staring polycrystalline silicon was put in a quartz glass tubular holding member, the bottom part was sealed by a quartz glass-made lid, the whole body was heated to 1500° C. to perfectly melt the silicon, and a single crystalline silicon was then lifted up in the same manner as the general CZ method. The result is shown in the column of Conventional Example (only silicon) of Table 1.

TABLE 1

|  | Example (silicon + germanium) | Conventional Example (only silicon) |
| --- | --- | --- |
| Furnace temp. in silicon melting start | 1000° C. | 1450° C. |
| Crystal growing melt holding surface temp. | 1235° C. | 1430° C. |
| Oxygen quantity in crystal | $1 \times 10^{16}$ atoms/cm$^3$ or more less than $1 \times 10^{18}$ atoms/cm$^3$ | $1$–$2 \times 10^{18}$ atoms/cm$^3$ |

As is apparent from Table 1, the single crystalline silicon could be manufactured at a temperature lower than the melting point according to the conventional CZ method by about 200° C. in the Example (silicon+germanium) of the present invention. The oxygen quantity incorporated into the single crystalline silicon could be also reduced to 1/100–1/1000 in the conventional CZ method.

Figure 2:
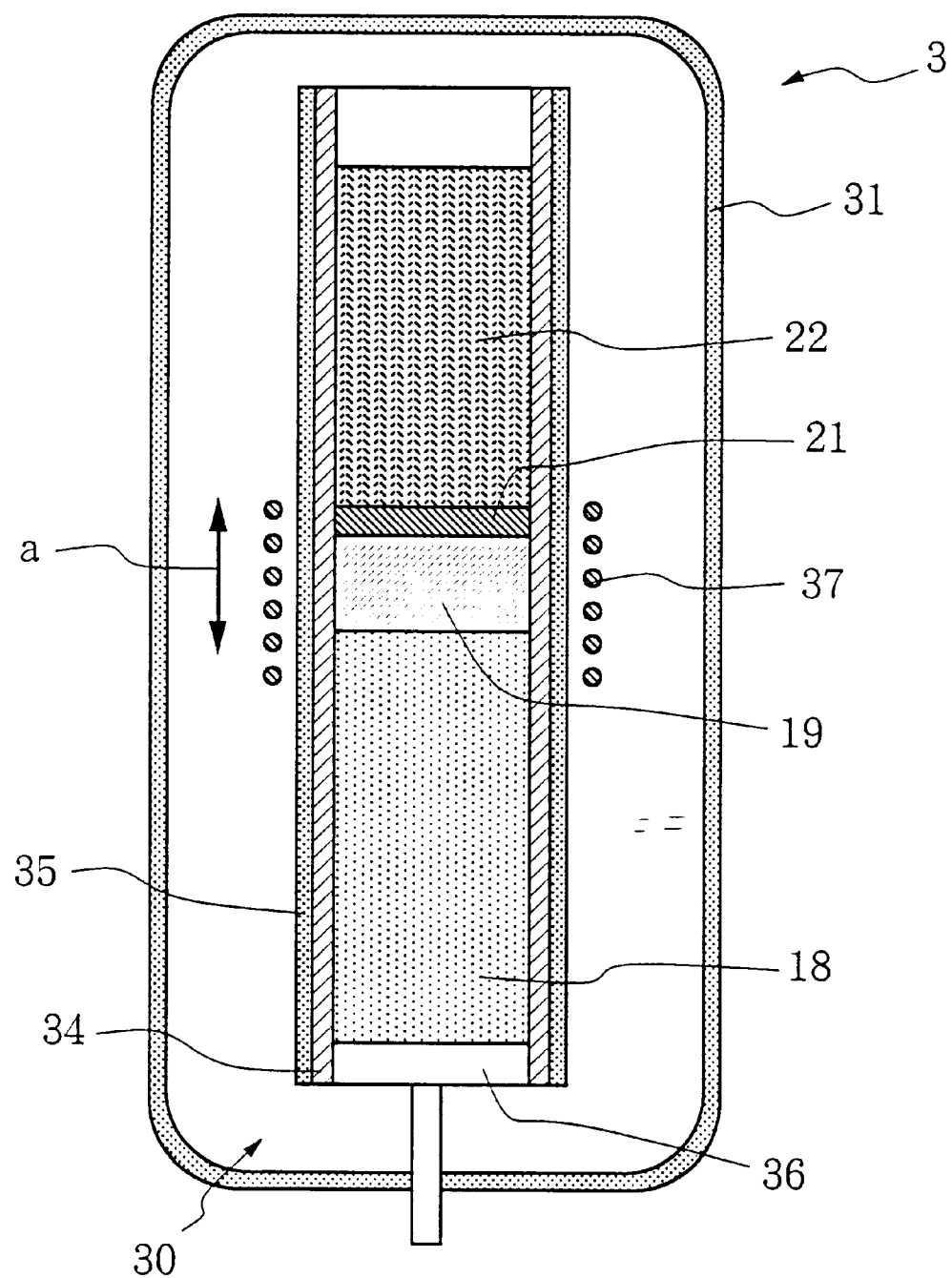
FIG. 2 is a sectional view showing a second embodiment of the present invention.

A second embodiment of the invention is described in reference to FIG. 2.

A single crystalline silicon manufacturing device 3 has a water-cooled chamber 31. A holding means 30 for holding massy starting polycrystalline silicon 18 and germanium melt 19 is arranged within the water-cooled chamber 31. The holding means 30 is formed of a tubular high purity quartz glass member 34, a high purity carbon-made holding member 35 forming an outer tube, and a bottom member 36 forming a bottom wall. The bottom member 36 is supported by a shaft integrally fixed thereto in such a manner as to be vertically movable.

The thickness of the quartz glass member 34 and the carbon member 35 for supporting it can be reduced, compared with the thickness of the quartz glass crucible and carbon-made holding member (carbon crucible) used in conventional CZ method. The reason for this is that the heating temperature in the execution of the present invention can be set to not a temperature equal to or high than 1413° C. of the melting point of silicon which is adapted in the conventional CZ method, but a temperature of about 1000–1400° C. which is close to the melting point of germanium, preferably 1150–1350° C.

A heating high frequency coil 37 is arranged on the circumference of the tubular support means 30 so as to heat a relatively narrow axial range. The high frequency coil 37 is vertically movable as shown by an arrow (a).

When the position of the germanium melt is fluctuated by the growing of silicon crystal, the high frequency coil 37 is moved so as to heat, centered with respect to the germanium melt layer 19, the upper part of the starting polycrystalline silicon 18 and the silicon melt 21 on the upper side thereof, as shown in the drawing.

When the bottom member 36 is pressed upward together with the lifting of silicon crystal to constantly keep the position of the germanium melt layer, the high frequency coil 37 can not be moved.

The high frequency coil 37 can be constituted so as to heat with a temperature gradient. It may have a structure separated into several heat zones.

In the manufacture of the single crystalline silicon 20, the starting polycrystalline silicon 18 is put in the cylindrical support means 30, and germanium is arranged thereon. The chamber is kept under vacuum inert gas atmosphere.

A power is applied to the high frequency coil 37 to make the carbon member 35 generate a heat, and the germanium and the periphery thereof are heated to about 1000–1350° C. to melt the germanium, whereby a germanium melt layer 19 is formed.

Then, the starting polycrystalline silicon 18 in the boundary area is dissolved into the germanium melt layer 19 regardless of the temperature lower than the melting point of silicon, and floated on the upper part of the germanium melt layer 19 by the density difference with germanium to form the silicon layer 21.

As the upper layer part of the silicon layer 21 is cooled and separated from the germanium melt layer, recrystallization occurs to produce the polycrystalline silicon 20.

Since the solid solubility of silicon with germanium is extremely low, the quantity of the germanium incorporated into the grown silicon crystal is about 0.5–1 atoms %.

In the above process, the silicon layer formed on the germanium melt layer 19 is kept at a temperature lower than the general melting point. Since only the narrow range of the germanium melt layer 19 and the periphery thereof is heated, the power consumption can be significantly reduced, compared with a conventional CZ furnace. The damage to the quartz glass member 15 contact with the melt is also minimized because of the low temperature. Further, the oxygen quantity incorporated into the silicon crystal can be also significantly reduced since the quantity of the silicon dioxide eluted into the melt is remarkably reduced.

EXAMPLE 2

By use of the silicon crystal manufacturing device described above, a silicon crystal lifting test was performed.

A quartz glass tube having an inside diameter of 200 mm and a length of 600 mm was used as the quartz glass-made tubular member, and a high purity carbon member was used as the outer tube. A cylindrical starting polycrystalline silicon (about 33 Kg) having a diameter of 200 mm and a height of 450 mm was put into the quartz glass tube, 2 Kg of germanium was arranged thereon, and the starting material upper part and the germanium were heated. When they were heated to 1200° C., it was confirmed that the germanium was perfectly melted to form a layer in a thickness of about 12 mm on the upper part of the silicon starting material, and a silicon melt layer was formed on the upper part thereof.

When the heating was continued at 1200° C. as it was, the thickness of the silicon melt layer on the upper part of the germanium was increased, and recrystallization was then started from the surface layer part of the silicon melt layer to form a silicon polycrystal. This polycrystal had a general dendrite type crystalline structure.

Since the position of the germanium layer is moved down as the quantity of silicon on the upper part of the germanium layer is increased, the high frequency coil 37 was moved so as to situate the germanium layer in the center during the manufacture.

At a result of measurement of the temperature near the silicon melt and the silicon polycrystal in the growing process, the size of one dendrite type crystal unit constituting the polycrystalline silicon 22 is 3–5 mm under the environment where the silicon crystal is gradually cooled at a speed of 50–200° C./hour. The outside of the recrystallized polycrystalline silicon 22 is supported by the holding means 30 so as to be cylindrically grown.

Thus, a large polycrystalline silicon of dendrite type crystal is useful for the application to a solar battery or the like.

EXAMPLE 3

Figure 3:
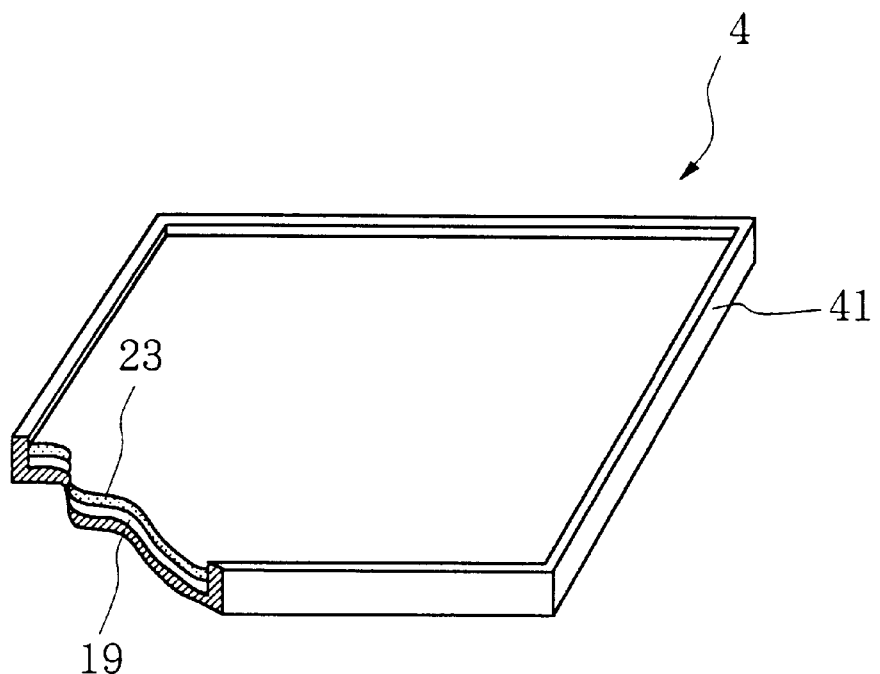
FIG. 3 is a partially perspective view showing a third embodiment of the present invention.

FIG. 3 shows a polycrystalline silicon manufacturing device 4 which is a third embodiment of the present invention.

A support means 41 is set within a chamber not shown, and kept in argon atmosphere.

In the polycrystalline silicon manufacturing device 4, the support means 41 has a rectangular shallow box shape so as to manufacture a polycrystalline silicon sheet.

Figure 4:
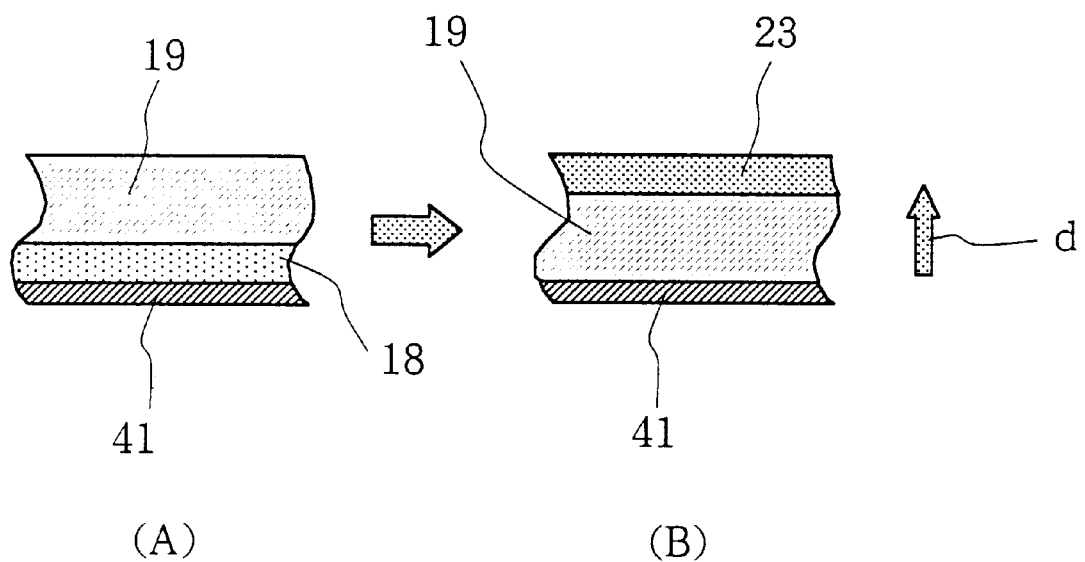
FIG. 4 is a view illustrating a manufacturing process in the manufacturing device of FIG. 3.

FIG. 4 shows a process of manufacturing a polycrystalline silicon sheet, wherein (A) shows the state before heating, and (B) shows the state after heating. A heating is performed by use of a heater not shown so as to impart a temperature gradient (the temperature is high in the lower part and low in the upper part) shown by an arrow (d) in FIG. 4(B), whereby a polycrystalline silicon sheet 23 is grown on the upper surface of a germanium melt 19. The temperature gradient is set to, for example, about 0.2–1.00° C./mm.

Thus, a thin plate-like silicon polycrystal can be directly provided, and the process of slicing can be omitted in the application to solar battery or the like.

Example of Application

Figure 5:
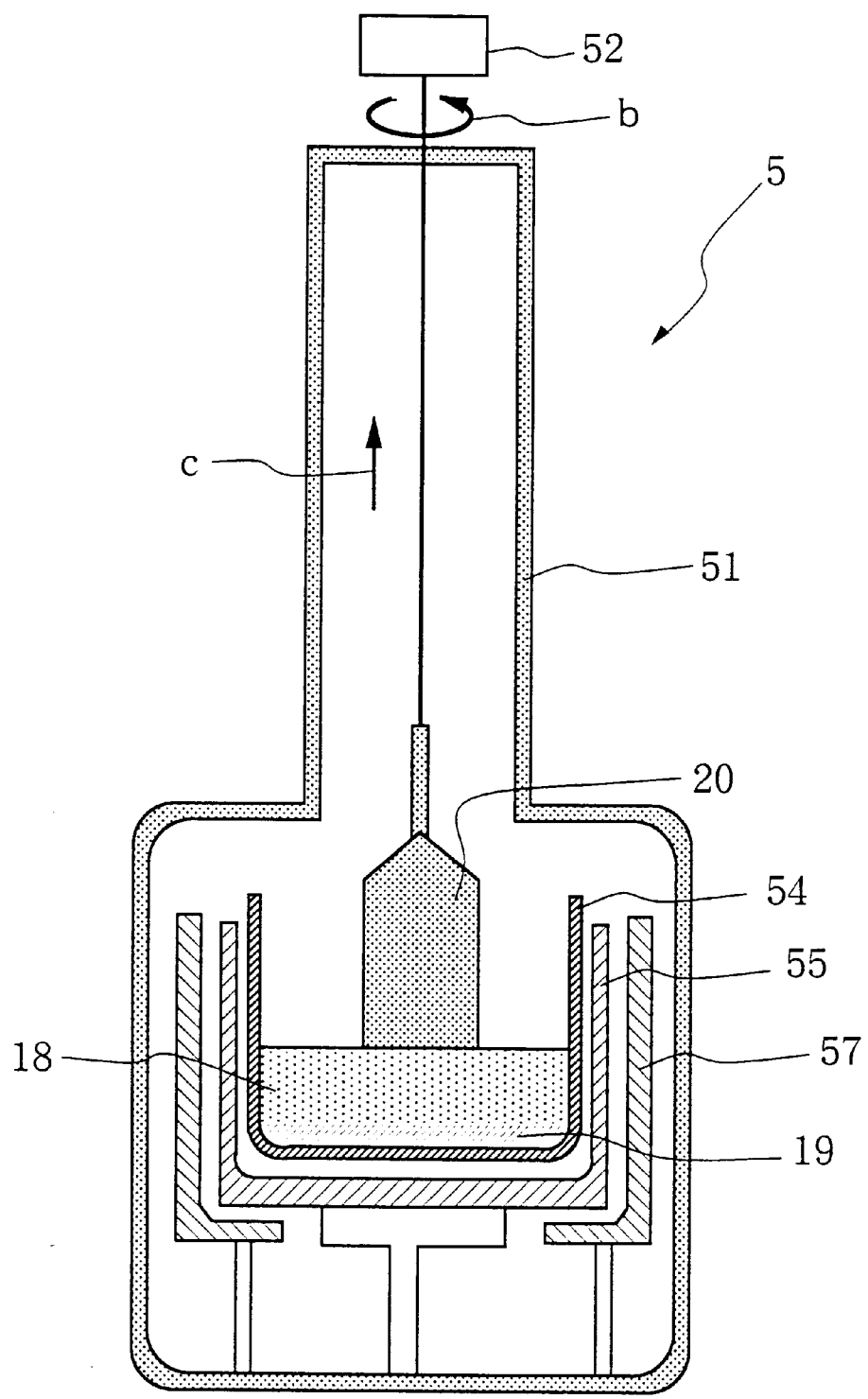
FIG. 5 is a sectional view showing an application of the present invention.

FIG. 5 shows an example of application of the present invention.

In this method for manufacturing single crystalline silicon, a conventional CZ type pulling device 5 can be used as it is. A lifting means 52 is provided on the upper part of the lifting device, and a lifting wire is pulled in an arrowed direction (c) to lift up the single crystalline silicon.

Silicon raw material and germanium are put in a quartz glass crucible 54 held in a carbon-made crucible 55 within a chamber 51, and heated by a heater 57 to melt the silicon and germanium. A germanium melt 19 is then formed on the bottom of the quartz glass crucible 54, a silicon melt 18 is arranged thereon, and a single crystalline silicon 20 is lifted up from there. In this method, also, the density difference between the germanium melt 19 and the silicon melt 18 is utilized.

According to this method, since the quantity of the silicon melt is increased, and the silicon distant from the germanium melt layer is crystallized at a temperature lower than the melting point, the temperature of the whole silicon melt must be set to a temperature equal to or higher than the melting point as in the past. However, the quartz on the crucible bottom part can be prevented from being eluted into the silicon melt, and the single crystalline silicon 20 with a low oxygen concentration can be lifted up.

As described in detail above, since the germanium melt is interposed between the solid silicon starting material and the silicon melt according to the present invention, the silicon crystal can be developed at a temperature greatly lower than the melting point of silicon.

Since the base liquid temperature for growing the silicon crystal can be lowered, the oxygen incorporated into the melt from the support member (crucible or the like) contact with the silicon fused solution, and, in its turn, into the silicon crystal can be significantly reduced, and the durable life of the support member can be remarkably improved. Further, the energy required for the manufacture of silicon crystal can be also significantly reduced.

The present invention is never limited by the embodiments described above. When the shape of the support member is changed, for example, a polycrystalline silicon according to this shape can be grown. Further, a heater other than high frequency heater, for example, a carbon-made resistant heating heater or the like can be used.

What is claimed is:

1. A method for manufacturing silicon crystal which comprises:

forming a germanium melt layer on a starting silicon material;

melting said starting silicon material into the germanium melt layer;

growing a silicon melt on top of said germanium melt layer; and obtaining the silicon crystal from said silicon melt.

2. A method for manufacturing silicon crystal according to claim 1 wherein a silicon melt layer is formed between the germanium melt layer and the silicon crystal.

3. A method for manufacturing silicon crystal according to claim 2 wherein the temperature of the silicon melt layer is lower than the melting point of silicon.

4. A method for manufacturing silicon crystal according to claim 1 wherein at least the germanium melt layer is heated to a temperature of 1000–1400° C.

5. A method for manufacturing silicon crystal according to claim 4 wherein the thickness of the germanium melt layer is set to 5–100 mm.

6. A method for manufacturing silicon crystal according to claim 4 wherein a heating is performed so as to produce a temperature gradient between the upper and lower parts of the germanium melt layer.

7. A method for manufacturing silicon crystal according to claim 4 wherein the silicon crystal is lifted up from the silicon melt layer by use of a seed crystal.

8. A method for manufacturing silicon crystal according to claim 2 wherein at least the germanium melt layer is heated to a temperature of 1000–1400° C.

9. A method for manufacturing silicon crystal according to claim 3 wherein at least the germanium melt layer is heated to a temperature of 1000–1400° C.

10. The method according to claim 1, wherein the starting silicon material comprises a solid amorphous silicon layer.

11. The method according to claim 1, wherein the starting silicon material comprises a solid polycrystalline silicon layer.

12. The method according to claim 1, wherein the silicon crystal comprises a silicon crystal grain having a grain size of from about 300 $\mu$m to about 15 mm.

13. The method according to claim 1, further comprising removing the silicon crystal from the germanium melt layer.

* * * * *